US008485123B2

(12) United States Patent
Dijksman et al.

(10) Patent No.: US 8,485,123 B2
(45) Date of Patent: *Jul. 16, 2013

(54) IMPRINT LITHOGRAPHY

(75) Inventors: Johan Frederik Dijksman, Weert (NL); Antonius Johannes Joseph Wismans, Sevenum (NL); Anke Pierik, Eindhoven (NL); Martin Maurice Vernhout, Geldrop (NL); Sander Frederik Wuister, Eindhoven (NL); Yvonne Wendela Kruijt-Stegeman, Eindhoven (NL)

(73) Assignees: ASML Netherlands B.V., Veldhoven (NL); Koninklijke Philips Electronics N.V., Eindhoven (NL)

( * ) Notice: Subject to any disclaimer, the term of this patent is extended or adjusted under 35 U.S.C. 154(b) by 0 days.

This patent is subject to a terminal disclaimer.

(21) Appl. No.: 13/184,049

(22) Filed: Jul. 15, 2011

(65) Prior Publication Data

US 2011/0268869 A1 Nov. 3, 2011

Related U.S. Application Data

(62) Division of application No. 11/394,334, filed on Mar. 31, 2006, now Pat. No. 8,001,924.

(51) Int. Cl.
| *B05B 7/06* | (2006.01) |
| *B05B 17/00* | (2006.01) |
| *B05B 13/02* | (2006.01) |
| *B05B 3/00* | (2006.01) |
| *B05C 1/00* | (2006.01) |
| *B05C 11/00* | (2006.01) |

(52) U.S. Cl.
USPC .......... 118/315; 118/313; 118/323; 118/304; 118/305; 118/211; 118/712; 118/713

(58) Field of Classification Search
USPC ................. 118/300, 313–315, 305, 323, 321, 118/712, 713, 211–213; 347/19, 20, 37, 40, 347/47, 49
See application file for complete search history.

(56) References Cited

U.S. PATENT DOCUMENTS

| 6,334,960 B1 | 1/2002 | Willson et al. |
| 6,482,742 B1 | 11/2002 | Chou |

(Continued)

FOREIGN PATENT DOCUMENTS

| JP | 04-315915 | 11/1992 |
| JP | 09-507806 | 8/1997 |

(Continued)

OTHER PUBLICATIONS

J. Haisma, et al., "Mold-Assisted Nonolithography: A Process for Reliable Pattern Replication", J. Vac. Sci. Technology, B 14(6), Nov./Dec. 1996.

(Continued)

*Primary Examiner* — Yewebdar Tadesse
(74) *Attorney, Agent, or Firm* — Pillsbury Winthrop Shaw Pittman LLP

(57) ABSTRACT

An imprint lithography apparatus is disclosed. The apparatus has a substrate table configured to support a lithographic substrate and a plurality of nozzles arranged to eject fluid onto the lithographic substrate, the plurality of nozzles extending over a distance which is substantially equal to or greater than a width of the substrate, wherein the nozzles, the lithographic substrate, or both, are moveable relative to the other.

20 Claims, 8 Drawing Sheets

U.S. PATENT DOCUMENTS

| | | |
|---|---|---|
| 6,646,662 B1 | 11/2003 | Nebashi et al. |
| 6,877,838 B2 * | 4/2005 | Elgee .............................. 347/40 |
| 8,001,924 B2 * | 8/2011 | Dijksman et al. .............. 118/315 |
| 2002/0089561 A1 * | 7/2002 | Weitzel et al. .................. 347/19 |
| 2003/0189604 A1 | 10/2003 | Bae et al. |
| 2004/0008334 A1 | 1/2004 | Sreenivasan et al. |
| 2004/0124566 A1 | 7/2004 | Sreenivasan et al. |
| 2004/0183851 A1 | 9/2004 | Nakamura |
| 2004/0250760 A1 | 12/2004 | Goto |
| 2005/0112294 A1 | 5/2005 | Masuda et al. |
| 2005/0255249 A1 | 11/2005 | Schlatterbeck et al. |
| 2005/0270312 A1 | 12/2005 | Lad et al. |

FOREIGN PATENT DOCUMENTS

| | | |
|---|---|---|
| JP | 2003-090709 | 3/2003 |
| JP | 2003-249440 | 9/2003 |
| JP | 2003-251792 | 9/2003 |
| JP | 2004-337709 | 2/2004 |
| JP | 2004-255316 | 9/2004 |
| JP | 2004-358353 | 12/2004 |
| JP | 2005-014453 | 1/2005 |
| JP | 2005-137971 | 6/2005 |
| JP | 2005-205883 | 8/2005 |
| JP | 2006-051708 | 2/2006 |
| JP | 2008-502157 | 1/2008 |
| WO | 2004/070809 | 8/2004 |
| WO | 2005/120834 | 12/2005 |

OTHER PUBLICATIONS

Notice of Reasons for Rejection for Japanese Patent Application No. 2007-075869 dated Feb. 5, 2010.

Office Action mailed Aug. 5, 2010 from the Japanese Patent Office for the related Japanese Patent Application No. 2010-105276.

Japanese Appeal Decision dated Feb. 15, 2012 in corresponding Japanese Patent Application No. 2007-075869.

* cited by examiner

IMPRINT LITHOGRAPHY

This application is a divisional of U.S. patent application Ser. No. 11/394,334, filed Mar. 31, 2006, now allowed-U.S. Pat. No. 8,001,924, which is incorporated in its entirety by reference.

FIELD

The present invention relates to imprint lithography.

BACKGROUND

A lithographic apparatus is a machine that applies a desired pattern onto a target portion of a substrate. Lithographic apparatus are conventionally used, for example, in the manufacture of integrated circuits (ICs), flat panel displays, ultra high density hard disks, lens arrays, photonic band gap devices and other devices involving fine structures.

It is desirable to reduce the size of features in a lithographic pattern because this allows for a greater density of features on a given substrate area. In photolithography, the increased resolution may be achieved by using radiation of shorter wavelength. However, there are problems associated with such reductions. Current systems are starting to adopt optical sources with wavelengths in and below the 193 nm regime but even at this level, diffraction limitations become a barrier. At lower wavelengths, the transparency of materials is very poor. Optical lithography machines capable of enhanced resolutions require complex optics and rare materials and are consequently very expensive.

An alternative for printing sub-100 nm features, known as imprint lithography, comprises transferring a pattern to a substrate by imprinting a pattern into an imprintable medium using a physical mould or imprint template. The imprintable medium may be the substrate or a material coated on to a surface of the substrate. The imprintable medium may be functional or may be used as a "mask" to transfer a pattern to an underlying surface. The imprintable medium may, for instance, be provided as a resist deposited on a substrate such as a semiconductor material into which the pattern defined by the imprint template is to be transferred. Imprint lithography is thus essentially a molding process on a micrometer or nanometer scale in which the topography of a imprint template defines the pattern created on a substrate. Patterns may be layered as with optical lithography processes so that, in principle, imprint lithography could be used for such applications as IC manufacture.

The resolution of imprint lithography is typically limited only by the resolution of the imprint template fabrication process. For instance, imprint lithography may be used to produce features in the sub-50 nm range with significantly improved resolution and line edge roughness compared to that achievable with a conventional optical lithography process. In addition, an advantage of imprint processes includes that they generally do not require expensive optics, advanced illumination sources or specialized resist materials that are often required in optical lithography processes.

Current imprint lithography processes may have one or more drawbacks as will be mentioned below, particularly with regard to achieving overlay accuracy and/or high throughput. However the significant improvement in resolution and/or line edge roughness attainable from imprint lithography is a strong driver for addressing one or more of those or other drawbacks.

SUMMARY

In an example imprint lithography process, a layer of an imprintable medium is spin coated onto the substrate. However, by using spin coating, it may be difficult to maintain a uniform thickness of imprintable medium material on the substrate. Additionally, if a large area of the substrate is covered with the spin coating, the chance of a part of the imprintable medium curing at a different rate to another part is increased. For example, in an imprint lithography process where UV radiation is used to cure the imprintable medium, spurious UV radiation may cause the imprintable medium to become cured before a pattern has been imprinted into it. A solution is the use of printing (e.g. ink-jet printing, bubble jet printing, etc., or any printing method which can eject droplets of fluid) to deposit the imprintable medium (or any layer which is to be deposited) onto the substrate. By using, for example, an ink-jet printing technique, small droplets of imprintable medium may be used to cover the area of a substrate to which a pattern is to be imprinted. The size of droplets of imprintable material deposited on the substrate may be accurately controlled and directed such that small areas of imprintable material may be uniformly deposited on a substrate.

The size of the imprintable material droplets used is inversely proportional to the number of droplets required to cover a given surface area. However, the larger the size of the imprintable material droplets used to cover the substrate, the longer adjacent droplets take to flow into one another. Therefore, even though less large droplets are required to be deposited on a given surface area, it may well be that the surface is not uniformly covered until a longer period of time has elapsed (i.e. it takes longer for the droplets to come into contact with each other and form a single layer). In order to overcome these problems, and balance a uniform coverage of the substrate with a quick substrate coverage, a single ink-jet nozzle (also referred to as a single nozzle liquid dispenser) may be used which deposits small droplets of imprintable material, but at a high frequency (e.g. 5 kHz). An example of this approach is described in United States patent application publication US 2004-0008334. While this solution may give uniform coverage of the substrate, and also may reduce the time for the droplets to flow into one another, it may still take a long time to deposit the imprintable medium over the entire area of the substrate, or in desired areas of the substrate.

According to a first aspect of the present invention there is provided an imprint lithography apparatus, comprising:

a substrate table configured to support a lithographic substrate; and a plurality of print heads provided with nozzles arranged to eject fluid onto the lithographic substrate, the print heads positioned such that footprints of adjacent print heads overlap, wherein the print heads, the lithographic substrate, or both, are moveable relative to the other.

According to a second aspect of the present invention, there is provided a fluid dispenser configured to eject fluid onto a lithographic substrate, the fluid dispenser comprising a plurality of print heads having nozzles arranged to eject fluid onto the lithographic substrate, the print heads positioned such that footprints of adjacent print heads overlap.

According to a third aspect of the present invention there is provided an imprint lithography method, comprising:

moving a plurality of print heads arranged to have footprints of adjacent print heads overlapping, moving a lithographic substrate, or moving both, relative to the other; and during movement, ejecting fluid from the print heads, such that the lithographic substrate or desired target areas of the lithographic substrate are covered with the fluid.

According to a fourth aspect of the present invention there is provided an imprint lithography apparatus, comprising:

a fluid dispenser having a nozzle arranged to eject a droplet of fluid onto a lithographic substrate; and a measurement apparatus arranged to measure a property of the droplet.

According to a fifth aspect of the present invention there is provided a method of imprint lithography, comprising:

ejecting a droplet of fluid from a fluid dispenser onto a lithographic substrate; and measuring a property of the droplet during ejection from the fluid dispenser onto the lithographic substrate.

According to a sixth aspect of the present invention there is provided a measurement apparatus to measure a property of a droplet of fluid ejected from a nozzle of an imprint lithography fluid dispenser, the apparatus comprising a detector and an optical system arranged to image onto the detector a droplet in flight between the nozzle and a lithographic substrate, or a shadow or reflection from the droplet.

According to a seventh aspect of the invention, there is provided an imprint lithography apparatus, comprising:

a substrate table configured to support a lithographic substrate; and a plurality of nozzles arranged to eject fluid onto the lithographic substrate, the plurality of nozzles extending over a distance which is substantially equal to or greater than a width of the substrate, wherein the nozzles, the lithographic substrate, or both, are moveable relative to the other.

According to an eighth aspect of the invention, there is provided a fluid dispenser to eject fluid onto a lithographic substrate, the fluid dispenser comprising a plurality of nozzles arranged to eject fluid onto the lithographic substrate, the nozzles extending over a distance which is substantially equal to or greater than a width of the substrate.

According to a ninth aspect of the invention, there is provided an imprint lithography method, comprising:

moving a lithographic substrate, moving a plurality of nozzles which extend over a distance which is substantially equal to or greater than a width of the lithographic substrate, or moving both, relative to the other; and during movement, ejecting fluid from the nozzles, such that the lithographic substrate or desired target areas of the lithographic substrate are covered with the fluid.

One or more embodiments of the present invention are applicable to any imprint lithography process in which a patterned template is imprinted into an imprintable medium in a flowable state, and for instance can be applied to hot and UV imprint lithography as described below. For the purpose of understanding one or more embodiments of the present invention, it is not necessary to describe the imprint process in any more detail than has already been given and is known in the art.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

There are two principal approaches to imprint lithography which will be termed generally as hot imprint lithography and UV imprint lithography. There is also a third type of "printing" lithography known as soft lithography. Examples of these are illustrated in FIGS. 1a to 1c.

Figure 1A:
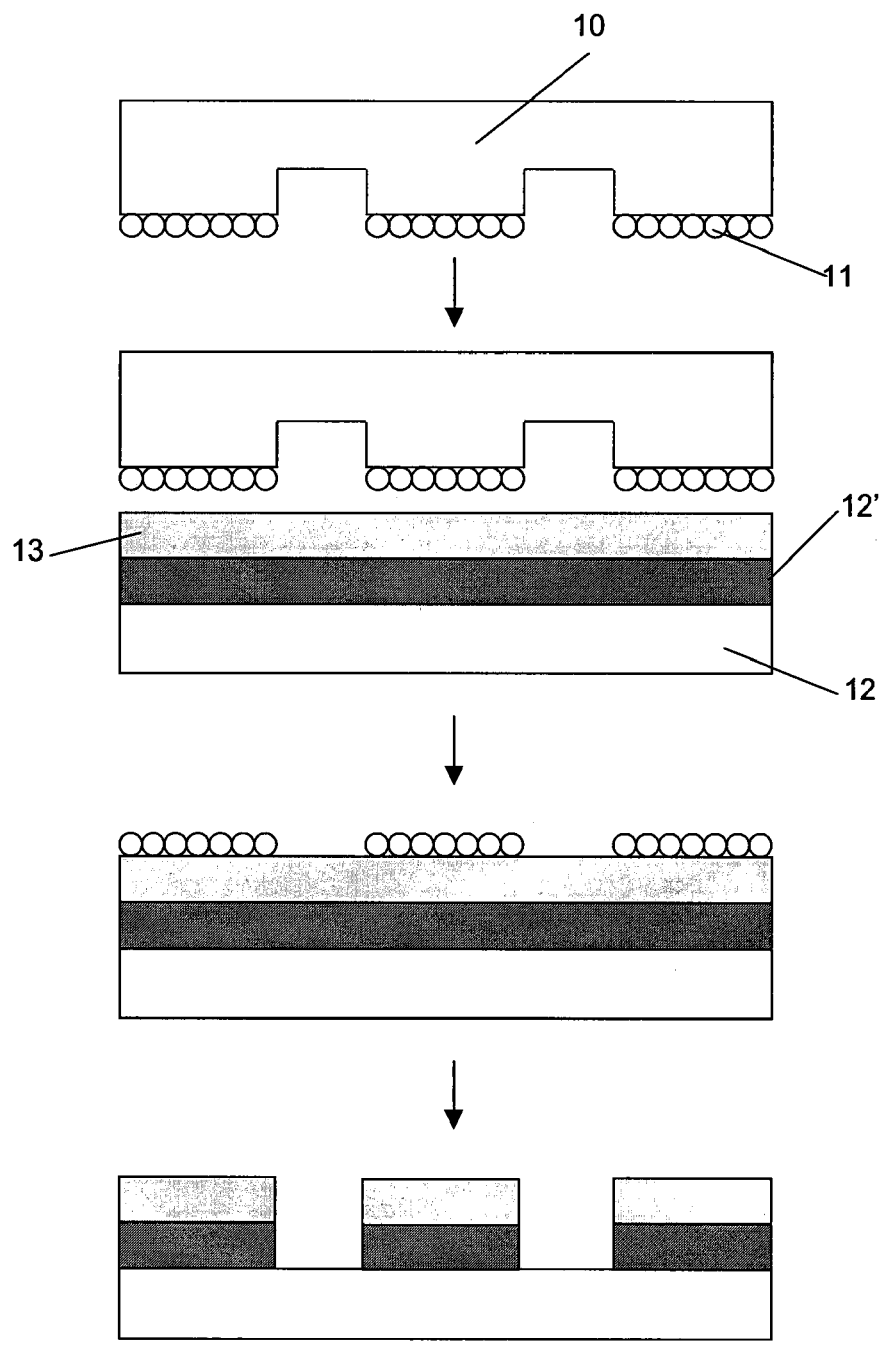
FIGS. 1a-1c illustrate examples of conventional soft, hot and UV lithography processes respectively.
Figure 1B:
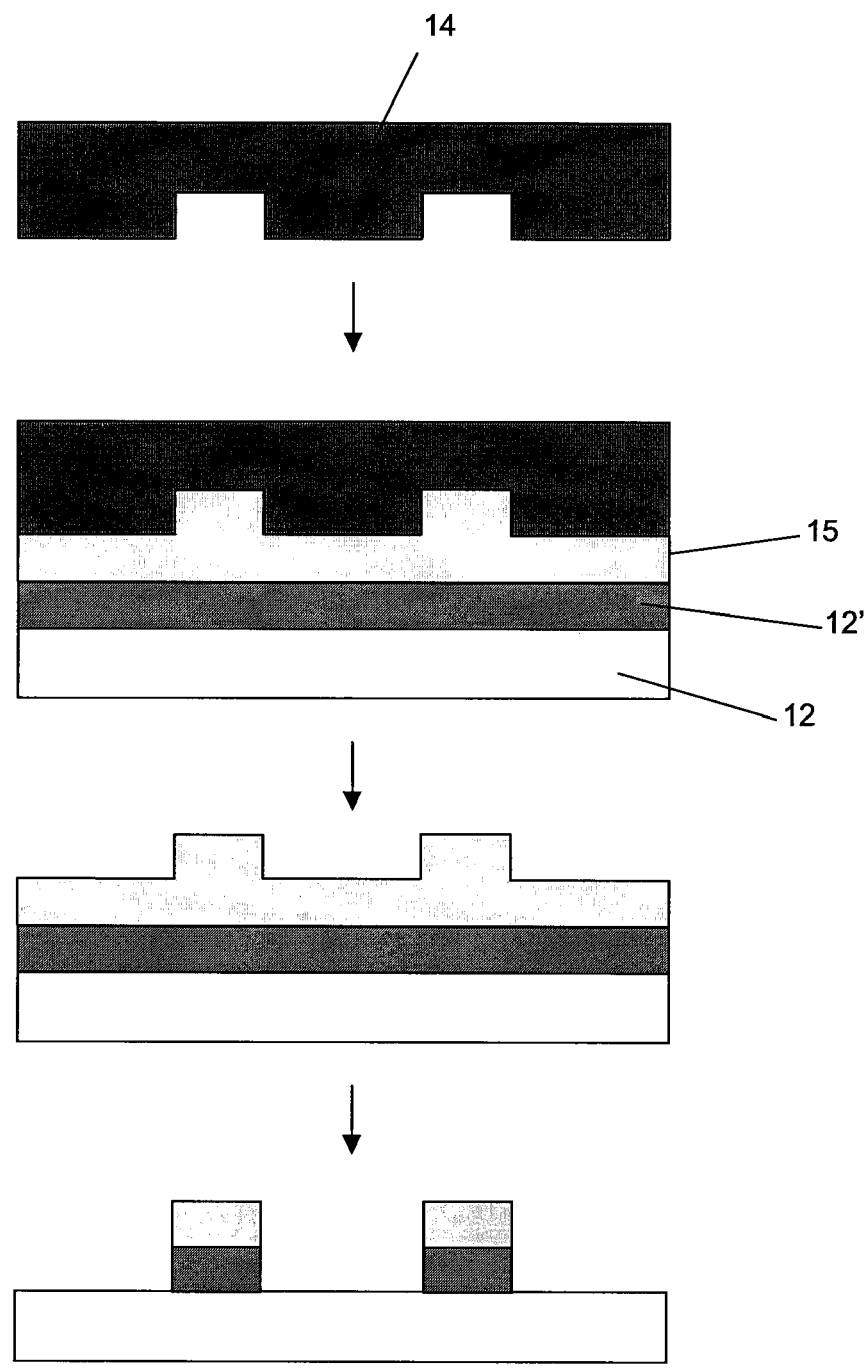
Figure 1C:
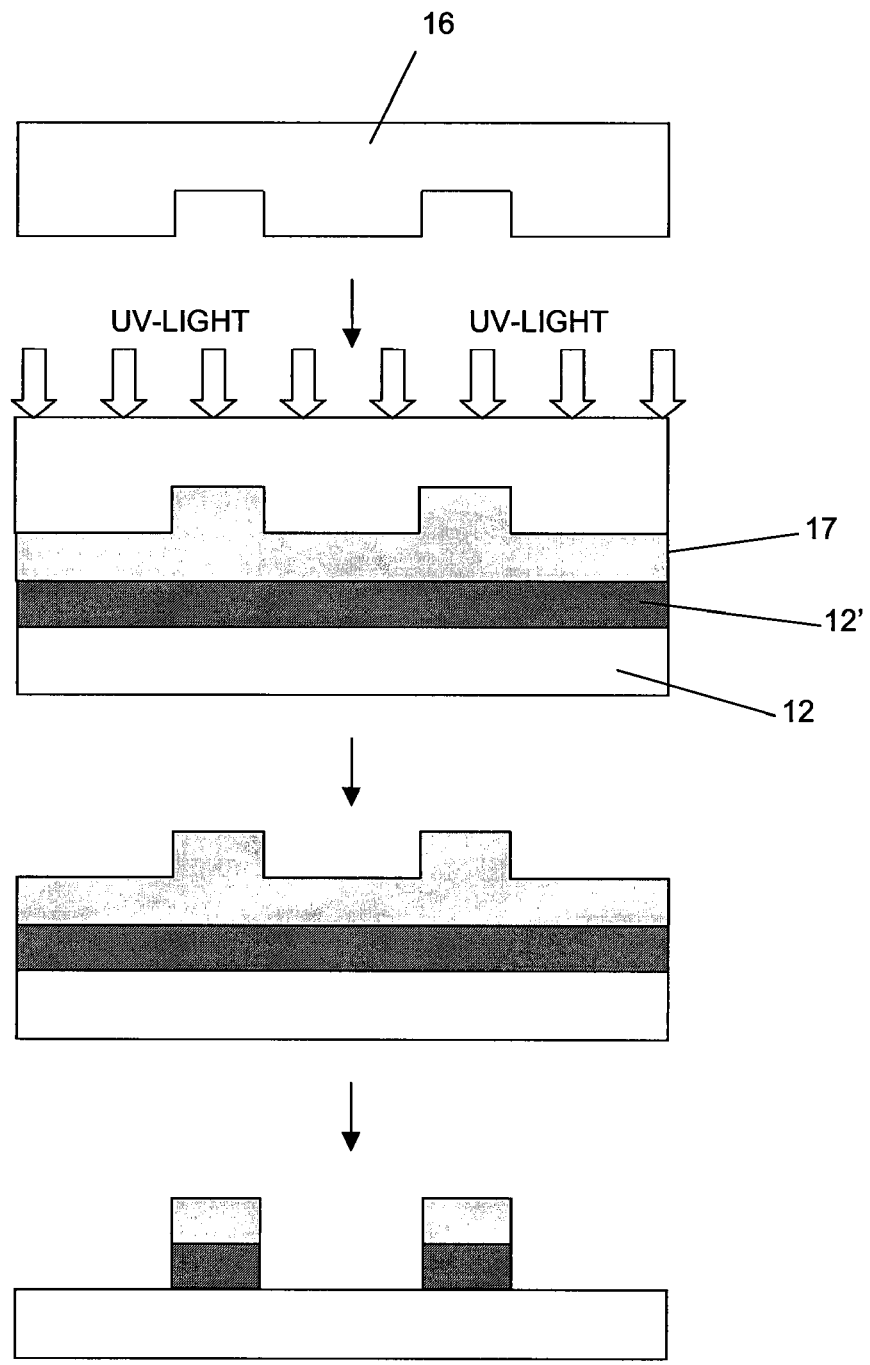

FIG. 1a schematically depicts the soft lithography process which involves transferring a layer of molecules 11 (typically an ink such as a thiol) from a flexible template 10 (typically fabricated from polydimethylsiloxane (PDMS)) onto a resist layer 13 which is supported upon a substrate 12 and planarization and transfer layer 12'. The template 10 has a pattern of features on its surface, the molecular layer being disposed upon the features. When the template is pressed against the resist layer, the layer of molecules 11 stick to the resist. Upon removal of the template from the resist, the layer of molecules 11 stick to the resist, the residual layer of resist is etched such that the areas of the resist not covered by the transferred molecular layer are etched down to the substrate.

The template used in soft lithography may be easily deformed and may therefore not be suited to high resolution applications, e.g. on a nanometer scale, since the deformation of the template may adversely affect the imprinted pattern. Furthermore, when fabricating multiple layer structures, in which the same region will be overlaid multiple times, soft imprint lithography may not provide overlay accuracy on a nanometer scale.

Hot imprint lithography (or hot embossing) is also known as nanoimprint lithography (NIL) when used on a nanometer scale. The process uses a harder template made from, for example, silicon or nickel, which are more resistant to wear and deformation. This is described for instance in U.S. Pat. No. 6,482,742 and illustrated in FIG. 1b. In a typical hot imprint process, a solid template 14 is imprinted into a thermosetting or a thermoplastic polymer resin 15, which has been cast on the surface of a substrate 12. The resin may, for instance, be spin coated and baked onto the substrate surface or more typically (as in the example illustrated) onto a planarization and transfer layer 12'. It should be understood that the term "hard" when describing an imprint template includes materials which may generally be considered between "hard" and "soft" materials, such as for example "hard" rubber. The suitability of a particular material for use as an imprint template is determined by its application requirements.

When a thermosetting polymer resin is used, the resin is heated to a temperature such that, upon contact with the template, the resin is sufficiently flowable to flow into the pattern features defined on the template. The temperature of the resin is then increased to thermally cure (e.g. crosslink) the resin so that it solidifies and irreversibly adopts the desired pattern. The template may then be removed and the patterned resin cooled.

Examples of thermoplastic polymer resins used in hot imprint lithography processes are poly (methyl methacrylate), polystyrene, poly (benzyl methacrylate) or poly (cyclohexyl methacrylate). The thermoplastic resin is heated so that it is in a freely flowable state immediately prior to imprinting with the template. It is typically necessary to heat thermoplastic resin to a temperature considerably above the glass transition temperature of the resin. The template is pressed into the flowable resin and sufficient pressure is applied to ensure the resin flows into all the pattern features defined on the template. The resin is then cooled to below its glass transition temperature with the template in place whereupon the resin irreversibly adopts the desired pattern. The pattern will consist of the features in relief from a residual layer of the resin which may then be removed by an appropriate etch process to leave only the pattern features.

Figure 2:
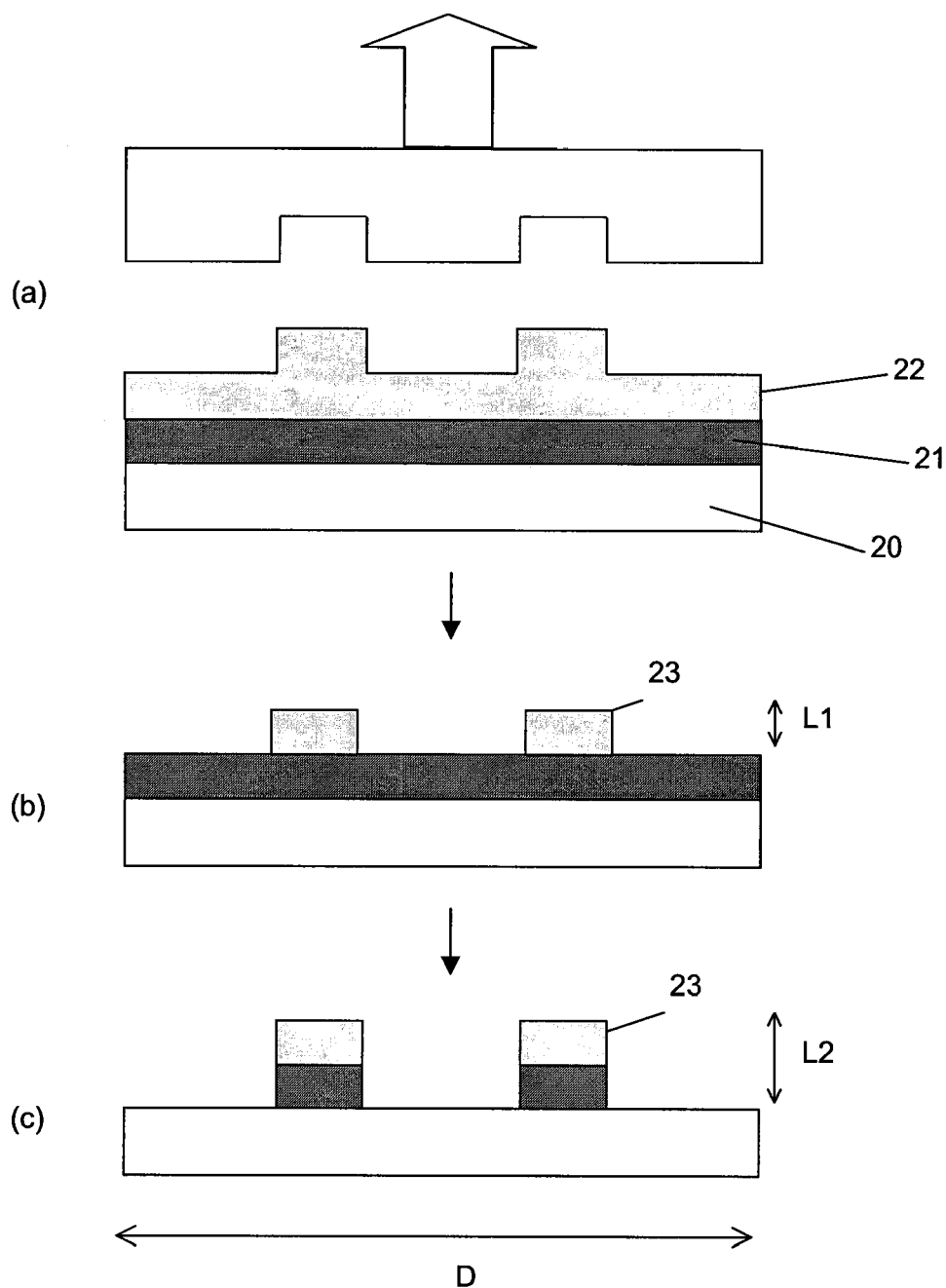
FIG. 2 illustrates a two step etching process employed when hot and UV imprint lithography is used to pattern a resist layer.

Upon removal of the template from the solidified resin, a two-step etching process is typically performed as illustrated in FIGS. 2a to 2c. The substrate 20 has a planarization and transfer layer 21 immediately upon it, as shown in FIG. 2a. The purpose of the planarization and transfer layer is twofold. It acts to provide a surface substantially parallel to that of the template, which helps ensure that the contact between the template and the resin is parallel, and also to improve the aspect ratio of the printed features, as described herein.

After the template has been removed, a residual layer 22 of the solidified resin is left on the planarization and transfer layer 21, shaped in the desired pattern. The first etch is isotropic and removes parts of the residual layer 22, resulting in a poor aspect ratio of features where L1 is the height of the features 23, as shown in FIG. 2b. The second etch is anisotropic (or selective) and improves the aspect ratio. The anisotropic etch removes those parts of the planarization and transfer layer 21 which are not covered by the solidified resin, increasing the aspect ratio of the features 23 to (L2/D), as shown in FIG. 2c. The resulting polymer thickness contrast left on the substrate after etching can be used as for instance a mask for dry etching if the imprinted polymer is sufficiently resistant, for instance as a step in a lift-off process.

Hot imprint lithography suffers from a disadvantage in that not only is the pattern transfer performed at a higher temperature, but also relatively large temperature differences might be required in order to ensure the resin is adequately solidified before the template is removed. Temperature differences between 35 and 100° C. may be needed. Differential thermal expansion between, for instance, the substrate and template may then lead to distortion in the transferred pattern. This may be exacerbated by the relatively high pressure needed for the imprinting step, due the viscous nature of the imprintable material, which can induce mechanical deformation in the substrate, again distorting the pattern.

UV imprint lithography, on the other hand, does not involve such high temperatures and temperature changes nor does it require such viscous imprintable materials. Rather, UV imprint lithography involves the use of a partially or wholly transparent template and a UV-curable liquid, typically comprising a monomer such as an acrylate or methacrylate, for example. UV imprint lithography is discussed, for example, in J. Haisma "Mold-assisted nanolithography: A process for reliable pattern replication", J. Vac. Sci. Technol. B 14(6), November/December 1996. In general, any photopolymerizable material could be used, such as a mixture of monomers and an initiator. The curable liquid may also, for instance, include a dimethyl siloxane derivative. Such materials tend to be less viscous than the thermosetting and thermoplastic resins used in hot imprint lithography and consequently move faster to fill template pattern features. Low temperature and low pressure operation also favors higher throughput capabilities. Although the name 'UV imprint lithography' implies that UV radiation is always used, those skilled in the art will be aware that any suitable actinic radiation may be used (for example, visible light may be used). Hence, any reference herein to UV imprint lithography, UV radiation, UV curable materials, etc. should be interpreted as including any suitable actinic radiation, and should not be interpreted as being limited to UV radiation only.

An example of a UV imprint process is illustrated in FIG. 1c. A quartz template 16 is applied to a UV curable resin 17 in a similar manner to the process of FIG. 1b. Instead of raising the temperature as in hot embossing employing thermosetting resins, or temperature cycling when using thermoplastic resins, UV radiation is applied to the resin through the quartz template in order to polymerize and thus cure it. Upon removal of the template, the remaining steps of etching the residual layer of resist are the same or similar as for the hot embossing process described herein. The UV curable resins typically used have a much lower viscosity than typical thermoplastic resins so that lower imprint pressures may be used. Reduced physical deformation due to the lower pressures, together with reduced deformation due to high temperatures and temperature changes, makes UV imprint lithography suited to applications requiring high overlay accuracy. In addition, the transparent nature of UV imprint templates can accommodate optical alignment techniques simultaneously to the imprinting.

Although this type of imprint lithography mainly uses UV curable materials, and is thus generically referred to as UV imprint lithography, other wavelengths of radiation may be used to cure appropriately selected materials (e.g., activate a polymerization or cross linking reaction). In general, any radiation capable of initiating such a chemical reaction may be used if an appropriate imprintable material is available. Alternative "activating radiation" may, for instance, include visible light, infrared radiation, x-ray radiation and electron beam radiation. In the general description herein, references to UV imprint lithography and use of UV radiation are not intended to exclude these and other activating radiation possibilities.

As an alternative to imprint systems using a planar template which is maintained substantially parallel to the substrate surface, roller imprint systems have been developed. Both hot and UV roller imprint systems have been proposed in which the template is formed on a roller but otherwise the imprint process is very similar to imprinting using a planar template. Unless the context requires otherwise, references to an imprint template include references to a roller template.

There is a particular development of UV imprint technology known as step and flash imprint lithography (SFIL) which may be used to pattern a substrate in small steps in a similar manner to optical steppers conventionally used, for example, in IC manufacture. This involves printing small areas of the substrate at a time by imprinting a template into a UV curable resin, 'flashing' UV radiation through the template to cure the resin beneath the template, removing the template, stepping to an adjacent region of the substrate and repeating the operation. The small field size of such step and repeat processes may help reduce or minimize pattern distortions and CD variations so that SFIL may be particularly suited to manufacture of IC and other devices requiring high overlay accuracy. United States patent application publication US 2004-0124566 describes in detail an example of a step and flash imprint lithography apparatus.

Although in principle the UV curable resin can be applied to the entire substrate surface, for instance by spin coating, this may be problematic when relatively volatile UV curable resins are employed.

One approach to addressing this problem is the so-called 'drop on demand' process in which the resin is dispensed onto a target portion of the substrate in droplets immediately prior to imprinting with the template. The liquid dispensing is controlled so that a certain volume of liquid is deposited on a particular target portion of the substrate. The liquid may be dispensed in a variety of patterns and the combination of carefully controlling liquid volume and placement of the pattern can be employed to confine patterning to the target area.

Dispensing the resin on demand as mentioned is not a trivial matter. The size and spacing of the droplets are carefully controlled to ensure there is sufficient resin to fill template features while at the same time minimizing excess resin which can be rolled to an undesirably thick or uneven residual layer since as soon as neighboring drops touch fluid, the resin will have nowhere to flow.

Although reference is made herein to depositing UV curable liquids onto a substrate, the liquids could also be deposited on the template and in general the same techniques and considerations will apply.

Figure 3:
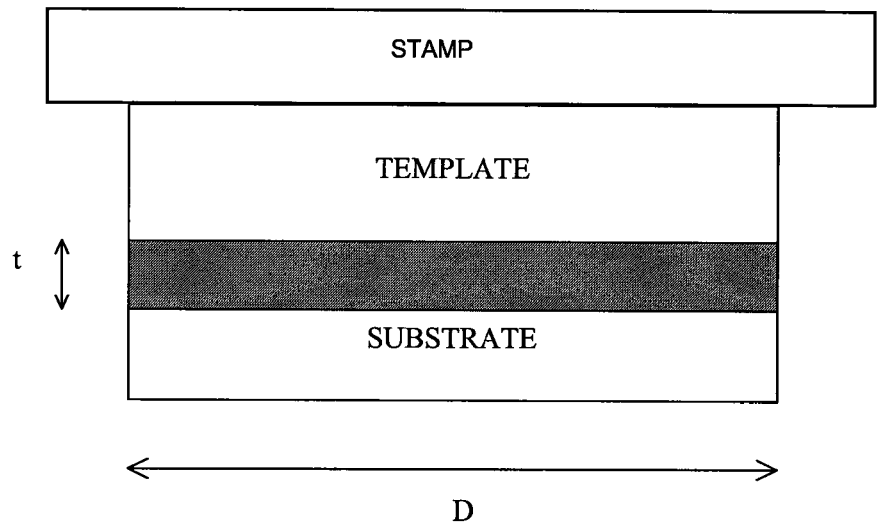
FIG. 3 schematically illustrates a template and a typical imprintable resist layer deposited on a substrate.

FIG. 3 illustrates the relative dimensions of the template, imprintable material (curable monomer, thermosetting resin, thermoplastic, etc) and substrate. The ratio of the width of the substrate, D, to the thickness of the curable resin layer, t, is of the order of $10^6$. It will be appreciated that, in order to avoid the features projecting from the template damaging the substrate, the dimension t should be greater than the depth of the projecting features on the template.

The residual layer left after stamping is useful in protecting the underlying substrate, but as mentioned herein it may also be the source of a problem, particularly when high resolution and/or minimum CD (critical dimension) variation is desired. The first 'breakthrough' etch is isotropic (non-selective) and will thus to some extent erode the features imprinted as well as the residual layer. This may be exacerbated if the residual layer is overly thick and/or uneven. This problem may, for instance, lead to variation in the thickness of lines ultimately formed in the underlying substrate (i.e. variation in the critical dimension). The uniformity of the thickness of a line that is etched in the transfer layer in the second anisotropic etch is dependant upon the aspect ratio and integrity of the shape of the feature left in the resin. If the residual resin layer is uneven, then the non-selective first etch can leave some of these features with "rounded" tops so that they are not sufficiently well defined to ensure good uniformity of line thickness in the second and any subsequent etch process. In principle, the above problem may be reduced by ensuring the residual layer is as thin as possible but this can require application of undesirably large pressures (possibly increasing substrate deformation) and relatively long imprinting times (possibly reducing throughput).

The template is a significant component of the imprint lithography system. As noted herein, the resolution of the features on the template surface is a limiting factor on the attainable resolution of features printed on the substrate. The templates used for hot and UV lithography are generally formed in a two-stage process. Initially, the desired pattern is written using, for example, electron beam writing (e.g., with an electron beam pattern generator), to give a high resolution pattern in resist. The resist pattern is then transferred into a thin layer of chrome which forms the mask for the final, anisotropic etch step to transfer the pattern into the base material of the template. Other techniques such as for example ion-beam lithography, X-ray lithography, extreme UV lithography, epitaxial growth, thin film deposition, chemical etching, plasma etching, ion etching or ion milling could be used. Generally, a technique capable of very high resolution will be used as the template is effectively a 1× mask with the resolution of the transferred pattern being limited by the resolution of the pattern on the template.

The release characteristics of the template may also be a consideration. The template may, for instance, be treated with a surface treatment material to form a thin release layer on the template having a low surface energy (a thin release layer may also be deposited on the substrate).

Another consideration in the development of imprint lithography is the mechanical durability of the template. The template may be subjected to large forces during stamping of the resist, and in the case of hot lithography, may also be subjected to extremes of pressure and temperature. This may cause wearing of the template, and may adversely affect the shape of the pattern imprinted upon the substrate.

In hot imprint lithography, there is a potential advantage in using a template of the same or similar material to the substrate to be patterned in order to reduce differential thermal expansion between the two. In UV imprint lithography, the template is at least partially transparent to the activation radiation and often quartz templates are used.

Although specific reference may be made in this text to the use of imprint lithography in the manufacture of ICs, it should be understood that imprint apparatus and methods described may have other applications, such as the manufacture of integrated optical systems, guidance and detection patterns for magnetic domain memories, hard disc magnetic media, flat panel displays, thin-film magnetic heads, etc.

While in the description herein, particular reference has been made to the use of imprint lithography to transfer a template pattern to a substrate via an imprintable resin effectively acting as a resist, in some circumstances the imprintable material may itself be a functional material, for instance having a functionally such as electrical or thermal conductivity, optical linear or non-linear response, among others. For example, the functional material may form a conductive layer, a semi-conductive layer, a dielectric layer or a layer having another desirable mechanical, electrical or optical property. Some organic substances may also be appropriate functional materials. Such applications may be within the scope of an embodiment of the present invention.

A problem of an imprint lithography process is the speed at which a pattern may be imprinted in an imprintable medium. The time taken to imprint a pattern depends on a variety of circumstances, such as for example: the time take to deposit the imprintable medium on the substrate, the time taken for the imprintable medium once deposited to reach an imprintable state (for example for imprintable medium droplets to coalesce), the time taken for the imprintable medium to flow about and into the patterned template once imprinted into the imprintable medium, and/or the time taken to cure the imprintable medium once the pattern has been formed therein. As mentioned above, imprintable medium may be deposited on the substrate in the form of droplets, so that the amount and position of the medium deposited on the substrate may be accurately controlled. This may reduce the time necessary for the imprintable medium to adopt a state whereby it is ready to be imprinted (e.g. when the droplets coalesce). As mentioned above, small droplets may be used to reduce the time for the imprintable medium droplets to coalesce, while ensuring a good coverage of the substrate with the imprintable medium. However, if a large area of a substrate needs to be covered, or a plurality of areas on that substrate need to be covered with the imprintable medium, a single ink jet nozzle may take a long time to deposit the required amount of imprintable medium on the substrate. Similarly, a single array of ink jet nozzles may take a long time to deposit the required amount of imprintable medium on the substrate.

Figure 4:
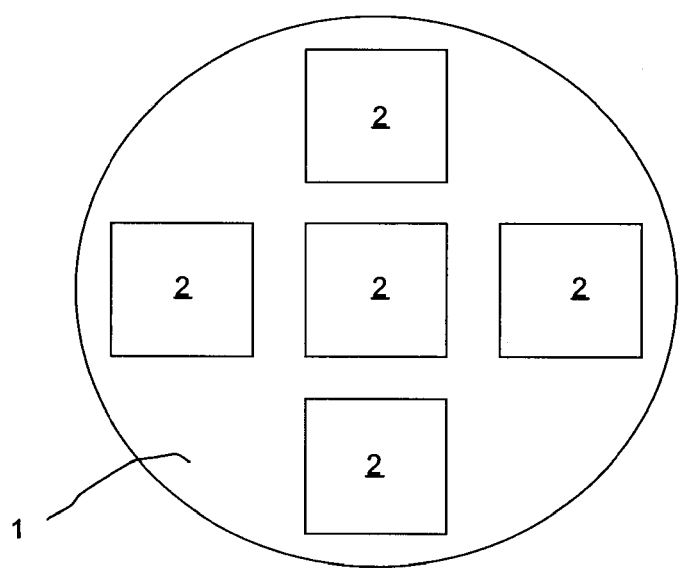
FIG. 4 schematically illustrates a plurality of imprintable resist layers deposited on a substrate.

To improve the throughput of imprint lithography processing, a plurality of areas of imprintable medium may be deposited on a substrate, and these areas may be imprinted simultaneously with a stamp having a plurality of templates disposed thereon, the location of the templates corresponding to the location of the areas of imprintable medium deposited on the substrate. FIG. 4 depicts a substrate 1 with a plurality of areas 2 of imprintable medium deposited thereon. By simultaneously imprinting a plurality of areas, a larger number of imprints may be achieved in a single stamping process. In order for this process to be effective, the imprintable medium should be deposited on the substrate in the required areas in a short period time to ensure that the throughput is maximized. However, using a single ink jet nozzle, or a single array of ink jet nozzles, it may take a long period of time to apply the necessary imprintable medium to the substrate.

Figure 5A:
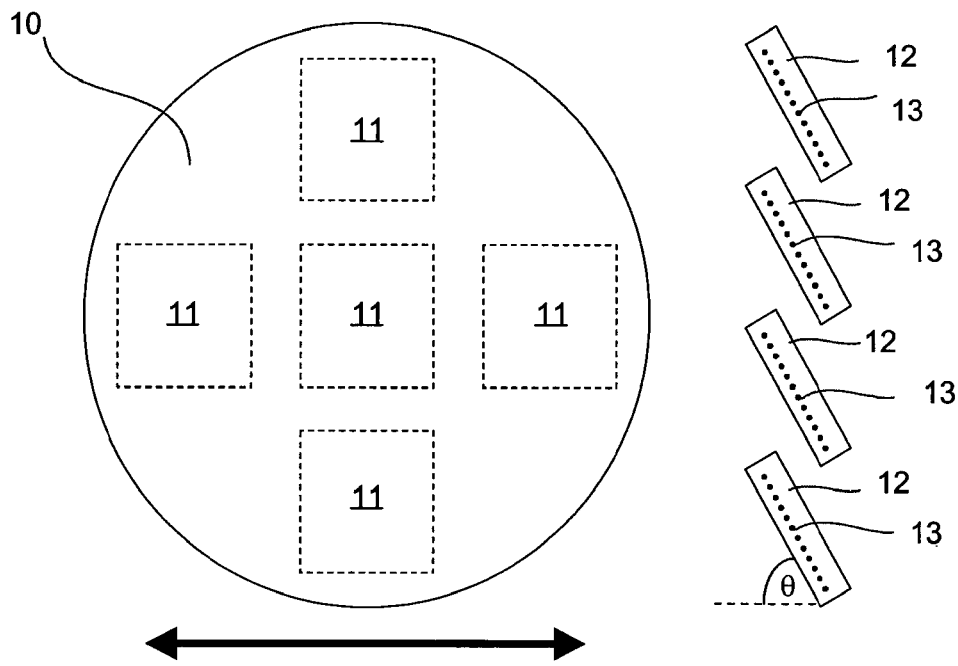
FIGS. 5a and 5b schematically show an imprint lithography apparatus according to an embodiment of the present invention.

FIG. 5a illustrates an embodiment of the present invention. FIG. 5a shows a substrate 10 supported by a movable substrate table (not shown). An imprintable medium is to be deposited on the substrate 10 in target areas 11 defined by dashed lines in FIG. 5a. The substrate 10 is moveable relative to a fluid dispenser comprising a plurality of print heads 12. Each of the print heads 12 comprises a plurality of nozzles 13 from which imprintable medium is ejected. The print heads 12 are arranged such that they are aligned at an angle θ relative to the direction of movement of the substrate 10 (shown by the arrow in FIG. 5a). The significance of this will be described in more detail later. The print heads 12 are arranged such that the nozzles extend over a distance which is substantially equal to (or greater than) the width (length, diameter, etc.) of the substrate 10. The term 'substantially equal to the width of the substrate' is intended to mean equal to the width of the substrate or equal to the width of that part of the substrate which is intended to receive imprintable medium. For example, if the substrate includes a rim which is not intended to receive imprintable medium, the nozzles may be arranged such that they do not extend over the rim. Alternatively some nozzles may extend over the rim, but may be switched off so that they do not eject imprintable medium.

As the substrate 10 is moved underneath the print heads 12, the print heads 12 are arranged to eject droplets of imprintable medium onto the target areas 11 of the substrate 10. Because the print heads 12 extend substantially across the width of the substrate 10, imprintable medium may be deposited on all desired target areas 11 of the substrate 10 in one scanning movement of the substrate 10 relative to the print heads 12. This may be achieved for example by moving the substrate 10 in a scanning movement beneath the print heads 12.

Figure 5B:
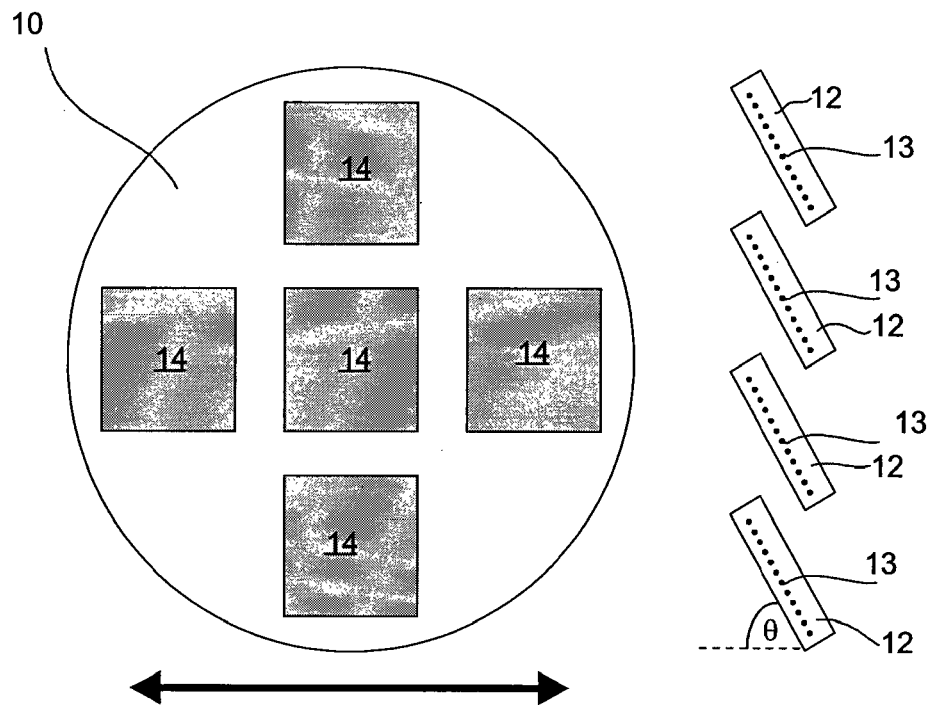

FIG. 5b shows that after the substrate 10 has been moved underneath the print heads 12, target areas 11 are covered by imprintable medium 14. The imprintable medium 14 has been quickly and accurately applied to the substrate 10 using the plurality of print heads 12. A plurality of target areas 11 may be covered quickly and uniformly using an embodiment of the present invention. For example, 25 target areas may be covered in a single scan of the substrate. It will be appreciated that more or less target areas may be covered.

Figure 6:
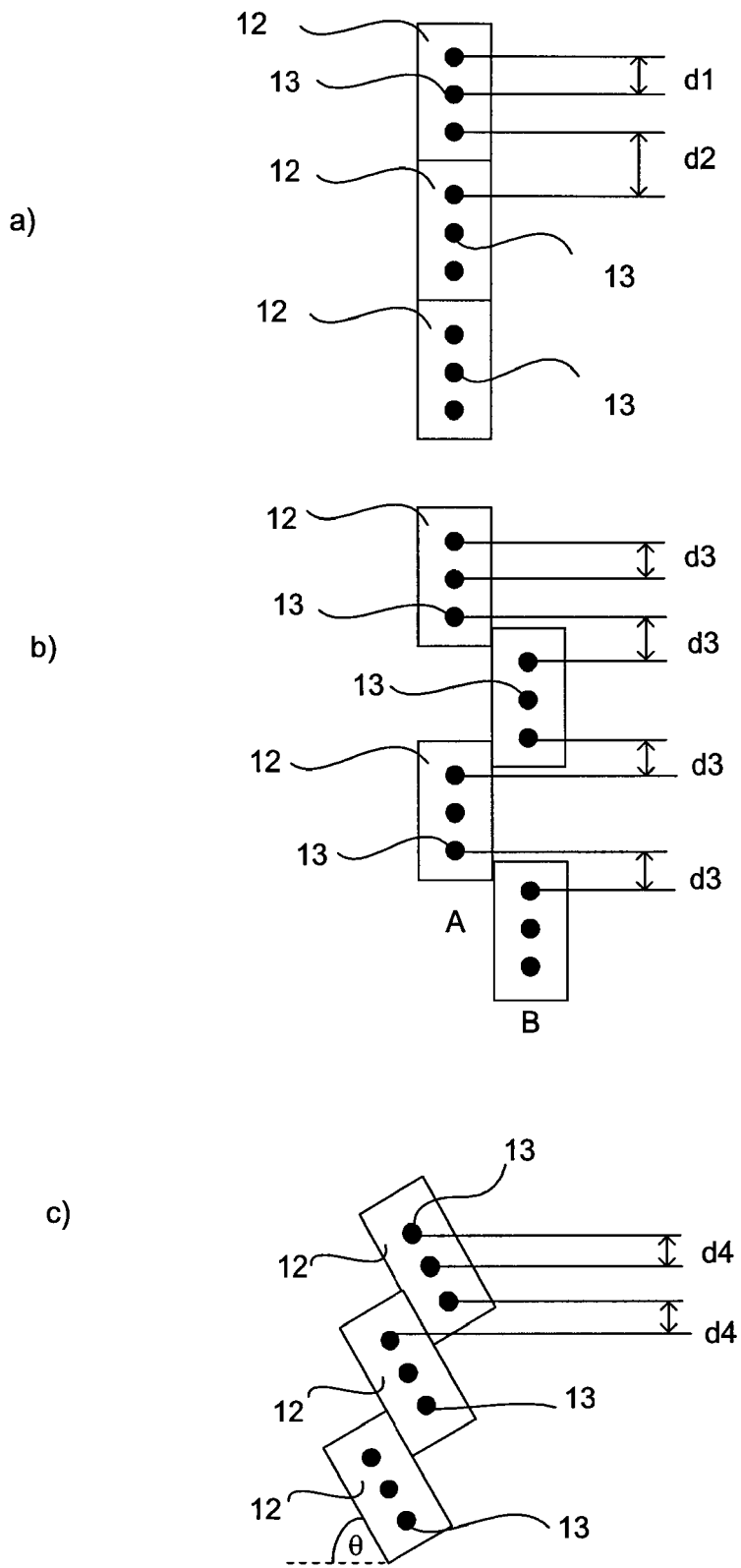
FIGS. 6a to 6c illustrate operating principles of an embodiment of the present invention.

It is not essential that the nozzles 13 are provided in a plurality of print heads. For example, the nozzles 13 may be provided in a single print head 12 which extends over a distance which is substantially equal to (or greater than) the width of the substrate 10. Such a print head may however be impractical to manufacture, as it may be difficult to ensure that all of the nozzles are accurately located relative to one another over the length of the print head. It may be more cost effective to use a plurality of print heads 12, and arrange these such that they extend over the required distance. Examples of suitable arrangements of print heads 12 are shown in FIGS. 6a to 6c. FIG. 6 is not intended to represent all possible arrangements of print heads, and other arrangements may be apparent to those skilled in the art.

FIG. 6a shows a plurality of print heads 12 arranged in a linear fashion (i.e. in a linear array). The print heads 12 are aligned in a direction substantially perpendicular to the direction of movement of the substrate (not shown but left to right in FIG. 6). As shown in FIG. 6a, it is possible that the spacing d1 between adjacent nozzles 13 on a given print head 12 is different from the spacing d2 between nozzles 13 at common ends of adjacent print heads 12. Such a difference in spacing may prevent target areas 11 of a substrate 10 from being uniformly covered by an imprintable medium. The increased spacing between nozzles 13 of adjacent print heads 12 may cause an increase of the time required for droplets ejected by those nozzles 13 to coalesce, thereby increasing the time taken for a uniform layer of imprintable material to form so that a template may be imprinted into the imprintable medium.

FIG. 6b shows an improved arrangement of print heads 12. A first row A of spaced apart print heads 12 is adjacent to a second row B of spaced apart print heads 12, both rows extending in a direction substantially perpendicular to the direction of movement of the substrate (not shown but left to right in FIG. 6). The spaces in the first row A correspond to the positions of print heads 12 in the second row B. By arranging the print heads 12 in this way, adjacent print heads 12 can be made to overlap, such that the spacing d3 between nozzles 13 of a given print head is equivalent to the spacing d3 between nozzles 13 at common ends of adjacent print heads 12. In order to achieve this the footprints of adjacent print heads 12 overlap. The term 'footprint' is intended to mean the length, substantially perpendicular to the direction of movement of the substrate, which is occupied by a given print head 12. The print heads 12 may be mounted such that their positions relative to one another are adjustable.

FIG. 6c shows another improved arrangement of print heads 12 which are arranged in a linear array. FIG. 6c shows that the print heads 12 have been aligned at an angle θ to the direction of movement of the substrate (not shown but left to right in FIG. 6). This has the effect that the footprints of adjacent print heads 12 overlap. By inclining the print heads 12, the spacing d4 between adjacent nozzles 13 on a given print head 12 is the same as the spacing d4 between adjacent nozzles 13 at common ends of adjacent print heads 12. In this particular embodiment, the spacing d4 between adjacent nozzles 13 is a function of the angle θ at which the print heads 12 are inclined. Thus, the spacing between adjacent nozzles may be readily controlled by varying the angle θ. The spacing between adjacent print heads 12 may also be varied. The print heads 12 may be mounted on adjustable mountings such that the angle θ and spacing between adjacent print heads may be adjusted. The angle θ may be selected such that the droplets of imprintable medium are ejected onto the surface of the substrate 10 with equal spacing in two dimensions. The spacing between ejected droplets in the direction of movement of a substrate 10 will depend on the speed of movement of the substrate, and the frequency of ejection of droplets from nozzles 13.

In an embodiment, in whatever configuration is adopted, the print heads 12 are arranged such that the nozzles 13 thereof extend across the entire width (length, diameter etc.) of the substrate, or at least target areas of the substrate. This allows the substrate, or target areas thereof, to be covered by imprintable medium ejected from the nozzles 13 in a single continuous movement of the substrate 10 relative to the nozzles 13.

As mentioned above, the time taken for droplets of imprintable medium deposited on the substrate to coalesce and therefore form a continuous layer is dependent upon the size of the droplets, together with the initial spacing between the droplets. Processing times, such as the delay between depositing the droplets of imprintable medium on the substrate 10 and imprinting a pattern into the imprintable medium, are determined from properties of the droplets. Therefore, if, for example, the shape of the droplets change, or the spacing between adjacent droplets changes, or a nozzle fails, the time taken for the droplets to coalesce and therefore form a continuous layer ready for imprinting will also change. If one or more nozzles were to fail then the uniformity of the layer might be compromised. It is therefore advantageous to monitor the droplets as they are ejected from the nozzles 13.

Figure 7:
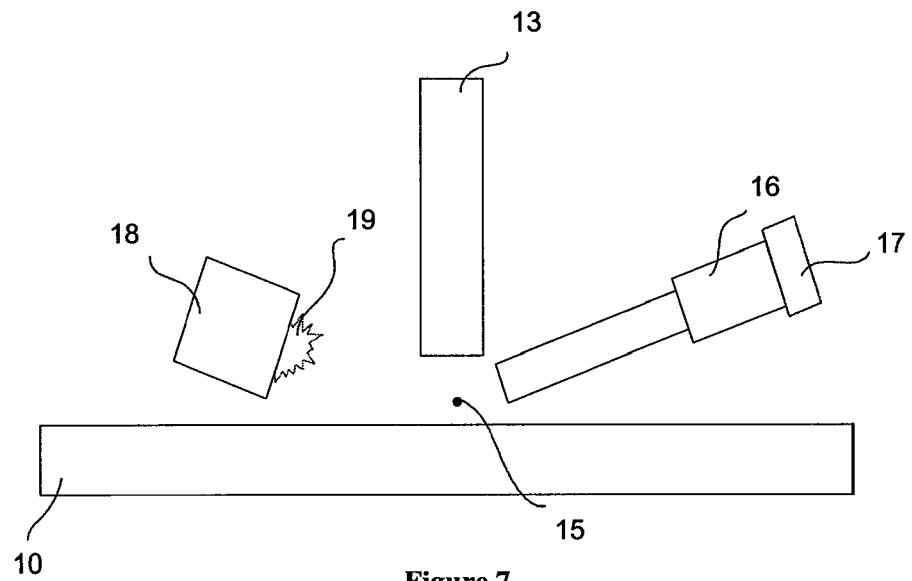
FIG. 7 schematically shows an imprint lithography apparatus according to another embodiment of the present invention.

FIG. 7 depicts a measurement apparatus configured to measure one or more properties indicative of one or more properties of one or more droplets as they are ejected from the nozzles 13. The term 'properties of droplets' is intended to include one or more of, for example, volume, straightness and velocity. A possible additional or alternative droplet property is the presence of one or more additional droplets.

FIG. 7 shows a nozzle 13 which has ejected a droplet 15 of imprintable medium. The droplet 15 is shown at a position between ejection from the nozzle 13 and prior to impinging upon the substrate 10. A microscope 16 is used to observe the droplet 15. An observation of the microscope 16 may be recorded using a CCD camera 17 and subsequently measured. The position at which the droplet 15 is observed may be determined using a strobe 18 which emits a flash of radiation 19 at a certain time after the nozzle is actuated (the nozzle may be actuated electrically). The timing of the flash of radiation 19 may be such that the droplet 15 is observed mid-way between ejection from the nozzle and impinging upon a substrate 10. For example, if droplets are ejected from the nozzle at a particular frequency, then the strobe 18 may be adjusted to emit flashes of radiation at that frequency and with a phase such that the droplet is observed in flight mid-way between ejection from the nozzle and impinging upon the substrate.

By observing the droplet at this time, not only may one or more dimensional properties (e.g. size, shape, volume, etc.) of the droplet 15 be measured, but also the trajectory of the droplet 15. The trajectory of the droplet 15 may be determined by comparing the position of the droplet in flight with the position of the nozzle 13 from which the droplet was ejected (the position of the measurement apparatus relative to the nozzle being known). Changes in one or more dimensional properties and/or the trajectory of the droplet may be used to give an indication of maintenance required to the nozzle 13 and/or print head 12, or be used to vary one or more operating parameters such as the movement of a substrate 10 relative to the nozzle 13, the angle θ at which the print heads 12 are aligned, the volume of the droplet to be ejected from the nozzle 13, etc. Depending upon the available space within the lithographic apparatus, it may be that the droplet 15 can be observed directly or indirectly (e.g. by observing the shadow or reflection of the droplet, for example on the substrate 10).

Optical observation of the droplet is not essential. Any suitable measurement technique may be used to determine one or more properties of the droplet.

Figure 8:
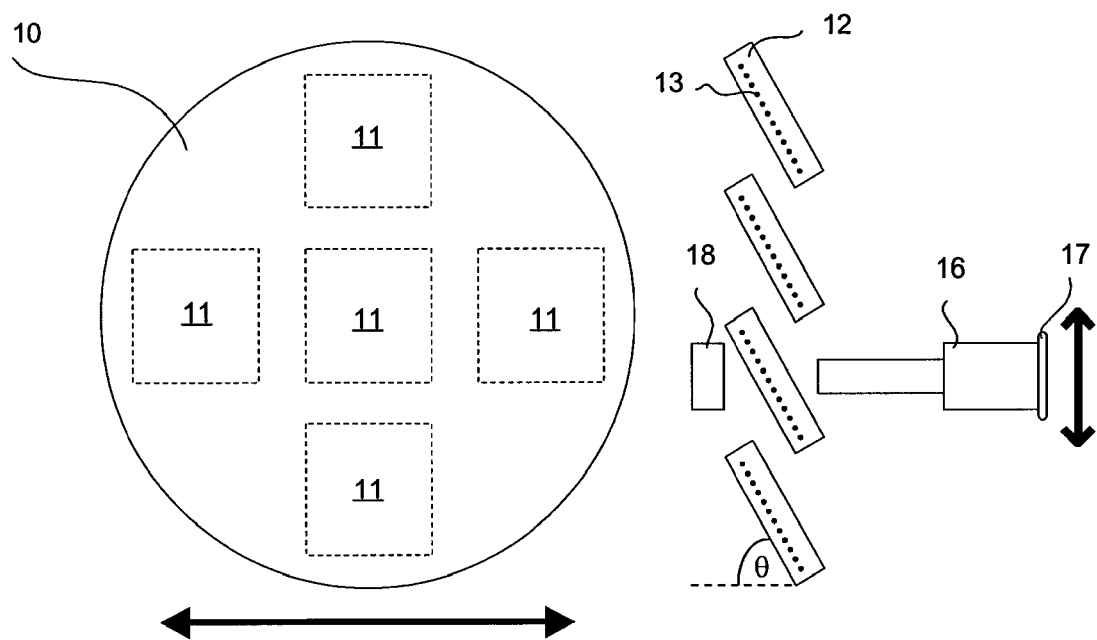
FIG. 8 schematically shows an imprint lithography apparatus combining the embodiment illustrated in FIGS. 5 and 6.

FIG. 8 shows a combination of the printing embodiment of FIGS. 5a and 5b and the droplet measurement embodiment of FIG. 7. FIG. 8 shows a substrate 10 moveable relative to a plurality of print heads 12. The print heads 12 are provided with a plurality of nozzles 13 configured to eject imprintable medium onto target areas 11 of a substrate 10. As described above in relation to FIGS. 5a and 5b, an imprintable medium may be deposited on target areas 11 of a substrate 10 in a quick and accurate manner in accordance with an embodiment of the present invention, which provides a fluid dispenser with a plurality of nozzles 13. While printing is taking place, the measurement apparatus comprising the microscope 16, CCD camera 17 and strobe 18 may be moved relative to and along the plurality of print heads 12 (as indicated by the arrow adjacent microscope 16) such that one or more droplets ejected from a nozzle 13 of any print head 12 may be observed and measured. The observation of the droplets need not be undertaken while printing is in progress, but may be undertaken in a calibration step.

In an embodiment, the microscope 16 and the CCD camera 17 may observe a droplet from a single nozzle 13, or droplets from several nozzles 13, depending on properties of the camera 17 and microscope 16. For example, the CCD camera 17 may have an array which is around 6 mm wide, and the microscope may have a field of view of around 6 mm. If the nozzles are 0.25 mm across, then this means that around 24 droplets can be imaged at the same time if a magnification of 1 is used. A higher magnification may be used, for example, to look at a single droplet, for more accurate determination of one or more of its properties. Where this is done, the number of droplets imaged onto the CCD camera will be reduced.

The microscope 16, CCD camera 17 and strobe 18 arrangement shown in FIG. 7 may be provided at a plurality of locations. For example, an arrangement may be provided for each print head 12. More than one arrangement may be provided per print head, for example to allow all nozzles to be viewed at the same time such that all emitted droplets can be observed. In an embodiment, a single strobe 18 may be provided with a plurality of microscope 16 and CCD camera arrangements.

One or more properties of the droplet may be measured directly or indirectly. For example, one or more properties indicative of one or more properties of the droplet may be determined from the size of a shadow of the droplet, or from the droplet's reflection. One or more properties measured may include a dimensional property of the droplet and/or a trajectory of the droplet.

Although the above description has referred to ejecting imprintable medium onto the substrate, the medium ejected onto the substrate need not be an imprintable medium. Any suitable fluid may be deposited. For example, the fluid may comprise a planarization layer or other fluid used in imprint lithography. The droplets may be less than 1000 picoliters (pl) in volume, less than 500 pl in volume, less than 250 pl in volume, less than 100 pl in volume, less than 50 pl in volume, less than 25 pl in volume, less than 10 pl in volume or even 1 pl in volume.

The above description has generally described the print heads 12 as being fixed and the substrate 10 as being held on a substrate table arranged to move the substrate relative to the print heads. It will be appreciated that the print heads 12 may alternatively or additionally be movable relative to the substrate table.

The term "substrate" may be interpreted as a substrate with no layers deposited thereon, or as a substrate with one or more layers already deposited thereon.

In an embodiment, there is provided an imprint lithography apparatus, comprising: a substrate table configured to support a lithographic substrate; and a plurality of print heads provided with nozzles arranged to eject fluid onto the lithographic substrate, the print heads positioned such that footprints of adjacent print heads overlap, wherein the print heads, the lithographic substrate, or both, are moveable relative to the other.

In an embodiment, the print heads extend over a distance which is substantially equal to or greater than a width of the substrate. In an embodiment, the print heads extend in a direction substantially perpendicular to a direction of movement of the print heads, the lithographic substrate, or both, relative to the other. In an embodiment, the print heads are inclined at an angle with respect to the direction of movement. In an embodiment, the print heads are mounted on respective adjustable mountings such that the angle can be adjusted. In an embodiment, the print heads are mounted on respective adjustable mountings such that the overlap between the footprints of adjacent print heads can be adjusted. In an embodiment, the print heads are arranged in two or more rows. In an embodiment, spaces are provided between adjacent print heads of a first row and of a second row, the spaces configured such that a space in the first row corresponds with a print head in the second row. In an embodiment, the nozzles are arranged to eject fluid in droplets having a volume of less than 100 picoliters. In an embodiment, in use, the droplets have a volume of less than 10 picoliters. In an embodiment, the fluid is an imprintable medium.

In an embodiment, there is provided a fluid dispenser configured to eject fluid onto a lithographic substrate, the fluid dispenser comprising a plurality of print heads having nozzles arranged to eject fluid onto the lithographic substrate, the print heads positioned such that footprints of adjacent print heads overlap.

In an embodiment, the print heads are mounted on respective adjustable mountings. In an embodiment, the print heads are inclined at an angle with respect to a direction along which the fluid dispenser extends. In an embodiment, the print heads extend over a distance which is substantially equal to or greater than a width of the substrate.

In an embodiment, there is provided an imprint lithography method, comprising: moving a plurality of print heads arranged to have footprints of adjacent print heads overlapping, moving a lithographic substrate, or moving both, relative to the other; and during movement, ejecting fluid from the print heads, such that the lithographic substrate or desired target areas of the lithographic substrate are covered with the fluid.

In an embodiment, the print heads extend over a distance which is substantially equal to or greater than a width of the substrate. In an embodiment, the movement of the prints heads, the lithographic substrate, or both, is in a single direction. In an embodiment, the print heads are fixed and the lithographic substrate moves relative to the print heads.

In an embodiment, there is provided an imprint lithography apparatus, comprising: a substrate table configured to support a lithographic substrate; and a plurality of nozzles arranged to eject fluid onto the lithographic substrate, the plurality of nozzles extending over a distance which is substantially equal to or greater than a width of the substrate, wherein the nozzles, the lithographic substrate, or both, are moveable relative to the other.

In an embodiment, the nozzles are provided in a single print head. In an embodiment, the nozzles are provided in a plurality of print heads.

In an embodiment, there is provided a fluid dispenser to eject fluid onto a lithographic substrate, the fluid dispenser comprising a plurality of nozzles arranged to eject fluid onto the lithographic substrate, the nozzles extending over a distance which is substantially equal to or greater than a width of the substrate.

In an embodiment, there is provided an imprint lithography method, comprising: moving a lithographic substrate, moving a plurality of nozzles which extend over a distance which is substantially equal to or greater than a width of the lithographic substrate, or moving both, relative to the other; and during movement, ejecting fluid from the nozzles, such that the lithographic substrate or desired target areas of the lithographic substrate are covered with the fluid.

In an embodiment, there is provided an imprint lithography apparatus, comprising: a fluid dispenser having a nozzle arranged to eject a droplet of fluid onto a lithographic substrate; and a measurement apparatus arranged to measure a property of the droplet.

In an embodiment, the measurement apparatus comprises a detector, and an optical system arranged to image a droplet in flight between the nozzle and the lithographic substrate onto the detector, or a shadow or reflection from the droplet. In an embodiment, the detector comprises a CCD camera. In an embodiment, the measurement apparatus further comprises a strobe arranged to illuminate the droplet when it is in flight. In an embodiment, the apparatus comprises a plurality of measurement apparatus. In an embodiment, the measurement apparatus is moveable relative to the fluid dispenser. In an embodiment, the apparatus comprises a plurality of measurement apparatus.

In an embodiment, there is provided a method of imprint lithography, comprising: ejecting a droplet of fluid from a fluid dispenser onto a lithographic substrate; and measuring a property of the droplet during ejection from the fluid dispenser onto the lithographic substrate.

In an embodiment, the measuring comprises imaging onto a detector the droplet when it is in flight between the fluid dispenser and the lithographic substrate, or a shadow or reflection from the droplet. In an embodiment, measurement indicates one or more dimensional properties of the droplet. In an embodiment, measurement indicates a trajectory of the droplet. In an embodiment, the method further comprises using a strobe to illuminate the droplet in flight between the fluid dispenser and the lithographic substrate.

In an embodiment, there is provided a measurement apparatus to measure a property of a droplet of fluid ejected from a nozzle of an imprint lithography fluid dispenser, the apparatus comprising a detector and an optical system arranged to image onto the detector a droplet in flight between the nozzle and a lithographic substrate, or a shadow or reflection from the droplet.

While specific examples of the invention have been described above, it will be appreciated that the present invention may be practiced otherwise than as described. The description is not intended to limit the invention.

The invention claimed is:
1. An imprint lithography apparatus, comprising:
a stamp configured to hold an imprint template having a pattern to imprint imprintable medium on a lithographic substrate;
a movable table configured to support the lithographic substrate;
a fluid dispenser having a nozzle arranged to eject a droplet of fluid onto the lithographic substrate; and
a measurement apparatus arranged to measure a property of the droplet and configured to change a position of the nozzle with respect to and over the substrate, a position of the substrate with respect to and under the nozzle, or both, based on the measured property.
2. The apparatus of claim 1, wherein the measurement apparatus comprises a detector, and an optical system arranged to image a droplet in flight between the nozzle and the lithographic substrate onto the detector, or a shadow or reflection from the droplet.

3. The apparatus of claim 2, wherein the detector comprises a CCD camera.

4. The apparatus of claim 2, wherein the measurement apparatus further comprises a strobe arranged to illuminate the droplet when it is in flight.

5. The apparatus of claim 2, comprising a plurality of measurement apparatus, each measurement apparatus separately comprising a detector and an optical system.

6. The apparatus of claim 1, wherein the measurement apparatus is moveable relative to the fluid dispenser.

7. The apparatus of claim 1, comprising a plurality of measurement apparatus, each measurement apparatus separately comprising a detector and an optical system.

8. The apparatus of claim 1, wherein the property comprises a dimensional property of the droplet and/or a trajectory of the droplet.

9. The apparatus of claim 1, wherein the measurement apparatus is configured to cause adjustment of the position of the nozzle based on the measured property.

10. The apparatus of claim 1, wherein the measurement apparatus is moveable with respect to the table.

11. The apparatus of claim 1, wherein the fluid dispenser comprises a plurality of print heads arranged to eject the fluid onto the lithographic substrate, wherein the plurality of print heads, the lithographic substrate, or both, is moveable relative to the other, wherein the print heads are positioned such that footprints of adjacent print heads overlap and extend in a direction substantially perpendicular and inclined at an angle with respect to a direction of movement of the plurality of print heads, the lithographic substrate, or both, relative to the other.

12. The apparatus of claim 11, wherein the plurality of print heads are mounted on respective adjustable mountings such that the angle and a spacing between the print heads can be adjusted.

13. The apparatus of claim 1, wherein the fluid dispenser comprises a plurality of print heads arranged to eject the fluid onto the lithographic substrate and wherein the plurality of print heads extend over a distance which is substantially equal to or greater than a width of the lithographic substrate.

14. The apparatus of claim 1, wherein the fluid dispenser comprises a plurality of print heads arranged to eject the fluid onto the lithographic substrate and wherein the plurality of print heads are mounted on respective adjustable mountings such that an angle, spacing and/or overlap between the footprints of adjacent print heads can be adjusted.

15. The apparatus of claim 1, wherein the fluid dispenser comprises a plurality of print heads arranged to eject the fluid onto the lithographic substrate, the plurality of print heads arranged in two or more rows.

16. The apparatus of claim 15, wherein spaces are provided between adjacent print heads of a first row and of a second row, the spaces configured such that at least one of the spaces in the first row corresponds with the position of at least one of the plurality of print heads in the second row.

17. The apparatus of claim 1, wherein the fluid dispenser is arranged to eject the fluid in droplets having a volume of less than 100 picoliters.

18. The apparatus of claim 1, wherein the fluid is imprintable medium.

19. The apparatus of claim 1, wherein the fluid dispenser comprises a plurality of print heads arranged to eject the fluid onto the lithographic substrate and wherein the plurality of print heads are inclined at an angle with respect to a direction along which the fluid dispenser extends.

20. An imprint lithography apparatus, comprising:
a stamp configured to hold an imprint template having a pattern to imprint imprintable medium on a lithographic substrate;
a movable table configured to support the lithographic substrate;
a fluid dispenser having a nozzle arranged to eject a droplet of fluid onto the lithographic substrate; and
a measurement apparatus arranged to measure a property of the droplet and configured to change an angular orientation of the nozzle with to and over the substrate based on the measured property.

* * * * *